United States Patent [19]
Liu

[11] Patent Number: 5,757,053
[45] Date of Patent: May 26, 1998

[54] EFFECTIVE LOAD LENGTH INCREASE BY TOPOGRAPHY

[75] Inventor: Chwen-Ming Liu, Shinchu, Taiwan

[73] Assignee: Taiwan Semiconductor Manufacturing Company Ltd., Hsin-Chu, Taiwan

[21] Appl. No.: 595,609

[22] Filed: Apr. 19, 1996

Related U.S. Application Data

[62] Division of Ser. No. 266,504, Jun. 27, 1994, Pat. No. 5,514,617.

[51] Int. Cl.$^6$ .......................... H01L 27/02; H01L 29/76
[52] U.S. Cl. .................. 257/380; 257/538; 257/904
[58] Field of Search .................... 257/379, 380, 257/536, 537, 538, 904

[56] References Cited

U.S. PATENT DOCUMENTS

| | | | |
|---|---|---|---|
| 5,087,956 | 2/1992 | Ikeda et al. | 257/904 |
| 5,268,325 | 12/1993 | Spinner, III et al. | 437/60 |
| 5,543,652 | 8/1996 | Ikeda et al. | 257/904 |

OTHER PUBLICATIONS

Ohzone et al., "A 2K×8-Bit Static MOS RAM with a New Memory Cell Structure", IEEE Journ. of SS Cir., vol. SC-15, No. 2, Apr. 1980 pp. 201-205.

Primary Examiner—Donald Monin
Attorney, Agent, or Firm—George O. Saile; Graham S. Jones, II

[57] ABSTRACT

A device and a method of manufacture of a semiconductor device on a semiconductor substrate including an SRAM cell with a resistor comprises forming a first polycrystalline silicon containing layer on the semiconductor substrate, patterning and etching the first polycrystalline silicon containing layer to form steps on either side thereof, forming a dielectric layer over the first polycrystalline silicon containing layer with the steps on either side of the first polycrystalline silicon containing layer, forming a blanket of a second polycrystalline silicon containing layer extending over the interpolysilicon layer, and ion implanting the second polycrystalline silicon containing layer in a blanket implant of a light dose of dopant including ion implanting resistive regions with far higher resistivity in the regions over the steps.

15 Claims, 4 Drawing Sheets

EFFECTIVE LOAD LENGTH INCREASE BY TOPOGRAPHY

This application is a Divisional of application Ser. No. 08/266,504, filed Jun. 27, 1994, which is now U.S. Pat. No. 5,514,617.

BACKGROUND OF THE INVENTION

1. Field of the Invention

This invention relates to SRAM devices and more particularly to resistors therefor.

2. Description of Related Art

The polysilicon load is a key module of a four transistor (4T) plus two resistor (2R) SRAM process. The load length is more and more critical in the process of manufacture of submicron devices due the scaling of the load length, since, paradoxically, the resistance is a function of length, yet the length is decreased as the scale of the device decreases.

U.S. Pat. No. 5,268,325 of Spinner et al for "Method for Fabricating a Polycrystalline Silicon Resistive Load Element in an Integrated Circuit" shows an increase of topography with spacers. The resistors are located directly over the flat areas of the device as indicated by the narrower brackets on either side of the drawings, as described at Col. 3, lines 49–61 and Col. 4, lines 18–20 and lines 39–43, etc.

SUMMARY OF THE INVENTION

Using the step height of a polysilicon gate under a polysilicon load or whatever layers are under the polysilicon load, the load length can increase so long as the height of the layer remains under the polysilicon load. Not only is the load length increased, but also the dopant distribution is changed within the portion of the increased length which is possible to reduce length down to 1 µm region drawn dimension.

In accordance with this invention, a device and a method of manufacture of a semiconductor device on a semiconductor substrate including an SRAM cell with a resistor comprises forming a first polycrystalline silicon containing layer on the semiconductor substrate, patterning and etching the first polycrystalline silicon containing layer to form steps on either side thereof, forming a dielectric layer over the first polycrystalline silicon containing layer with the steps on either side of the first polycrystalline silicon containing layer, forming a blanket of a second polycrystalline silicon containing layer extending over the interpolysilicon layer, and ion implanting the second polycrystalline silicon containing layer in a blanket implant of a light dose of dopant including ion implanting resistive regions with far higher resistivity in the regions over the steps.

Preferably, the dopant is selected from arsenic, phosphorus, boron, and $BF_2$ ions implanted within the range from about $1E13cm^{-2}$ to about $1E14cm^{-2}$; the implant of a light dose of dopant into the second polycrystalline silicon containing layer is applied at from about 20 keV to about 100 keV.

Alternatively, it is preferred that the implant of a light dose of dopant into the second polycrystalline silicon containing layer comprises an arsenic dopant implanted within the range from about $2E13cm^{-2}$ to about $1E14cm^{-2}$.

Preferably, the first polycrystalline silicon containing layer has a thickness from about 2,000 Å to about 5,000 Å; the second polycrystalline silicon containing layer has a thickness from about 300 Å to about 1,500 Å; the dielectric layer comprises a silicon dioxide layer having a thickness from about 500 Å to about 3,000 Å; contacts are formed by the steps comprising forming a contact mask on the device, doping a contact dopant through the contact mask, and depositing metallization through the mask; and the dose comprises phosphorus ions implanted within the range from about $2E14cm^{-2}$ to about $5E15cm^{-2}$.

In another aspect of this invention, a semiconductor device on a semiconductor substrate including an SRAM cell with a resistor comprises a first polycrystalline silicon containing layer on the semiconductor substrate patterned with steps on either side thereof, a dielectric layer over the first polycrystalline silicon containing layer with the steps on either side of the first polycrystalline silicon containing layer, a blanket polycrystalline silicon containing layer extending over the dielectric layer, the ion implanted in the polycrystalline silicon containing layer in a blanket implant of a light dose of dopant including ion implanting resistive regions with far higher resistivity in the regions over the steps; the light dose of dopant is selected from arsenic, phosphorus, boron, and $BF_2$ ions implanted within the range from about $1E13cm^{-2}$ to about $1E14cm^{-2}$.

Alternatively, the light dose comprises arsenic ions implanted within the range from about $2E14cm^{-2}$ to about $5E15cm^{-2}$; and the first polycrystalline silicon containing layer has a thickness from about 2,000 Å to about 5,000 Å; the second polycrystalline silicon containing layer has a thickness from about 300 Å to about 1,500 Å and the dielectric layer has a thickness from about 500 Å to about 3,000 Å; and contacts are formed on the device, into a region doped with a dose comprising phosphorus ions implanted within the range from about $2E14cm^{-2}$ to about $5E15cm^{-2}$.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
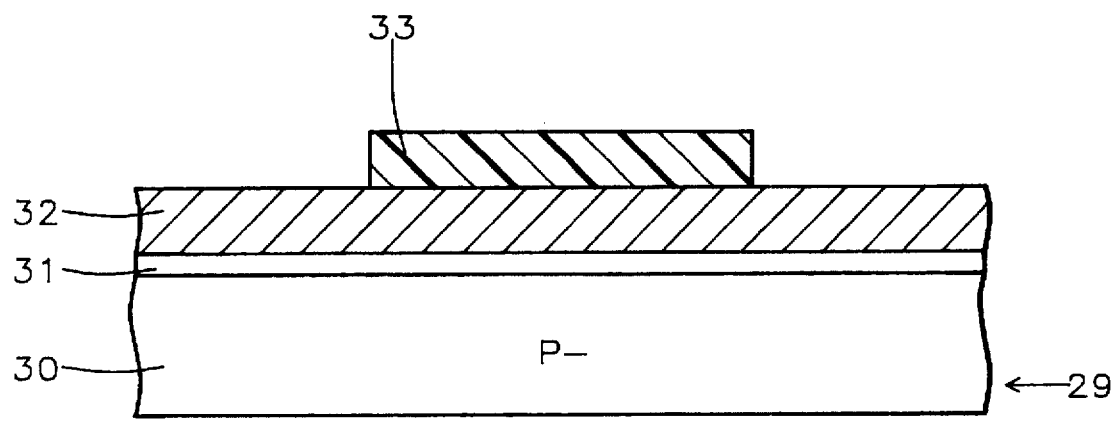
FIG. 1 shows a sectional view of a VLSI device in accordance with this invention in an early phase of the process of manufacture of that device.

FIG. 1 shows a sectional view of a VLSI device in accordance with this invention in an early phase of the process of manufacture of that device. A P– silicon substrate is covered with a gate oxide layer 31 which in turn is coated with a first polycrystalline silicon layer comprising a control gate layer 32. Layer 32 is preferably composed of polysilicon 1 or polycide having a preferred thickness from about 2,000 Å to about 5,000 Å. A photoresist mask 33 has been applied and patterned by conventional photolithographic techniques.

Figure 2:
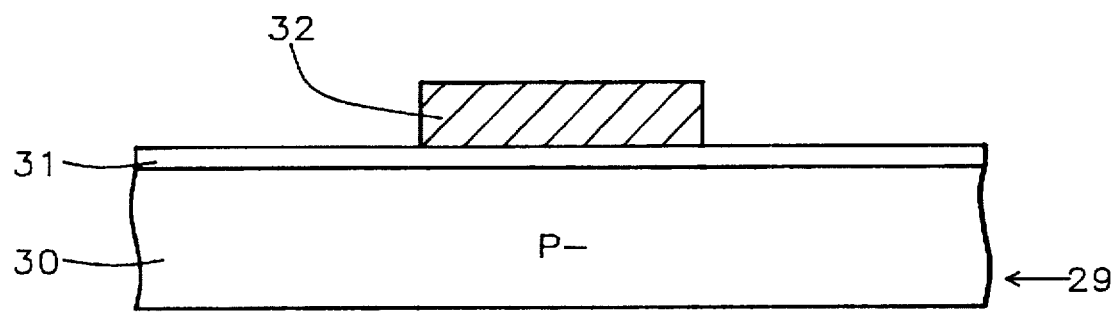
FIG. 2 shows the device of FIG. 1 with the first polycrystalline containing layer etched by a conventional etchant for the polysilicon or polycide, etc. used to form a control gate.

FIG. 2 shows the device of FIG. 1 with the first polycrystalline silicon layer 32 etched by a conventional etchant for the polysilicon or polycide, etc. used to form a control gate 32.

Figure 3:
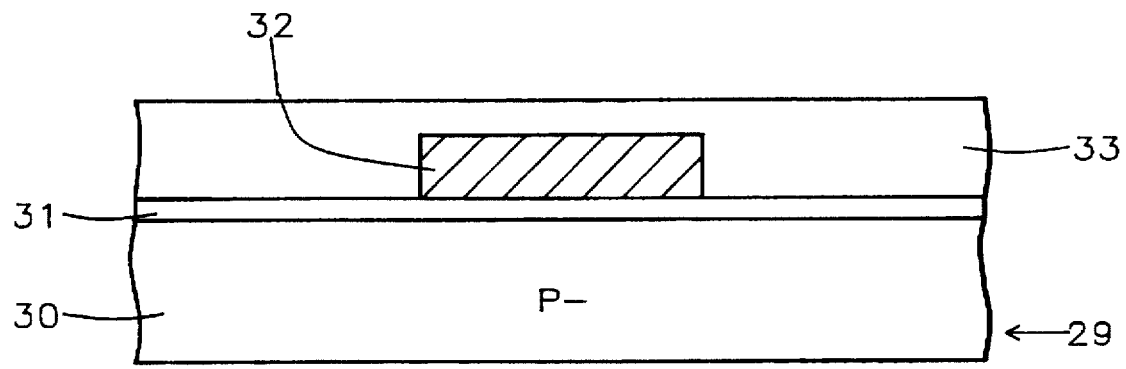
FIG. 3 shown the device of FIG. 2 after a spacer layer of silicon dioxide has been formed.

FIG. 3 shown the device of FIG. 2 after a spacer layer 33 of silicon dioxide has been formed by a conventional process.

Figure 4:
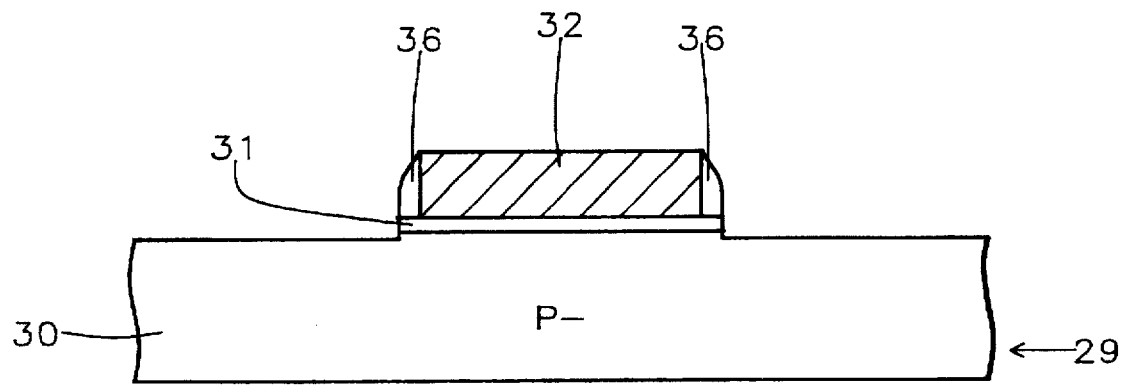
FIG. 4 shows the device of FIG. 3 after the spacer layer has been etched with an etchant for silicon dioxide which leaves the spacers, but removes the gate oxide layer except under the spacers and the control gate.

FIG. 4 shows the device of FIG. 3 after the spacer layer 36 has been etched with an etchant for silicon dioxide which leaves the spacers 36, but removes the gate oxide layer 31 except under the spacers 36 and the control gate 32. It can be seen that the substrate 30 has been etched slightly by the etchant.

Figure 5:
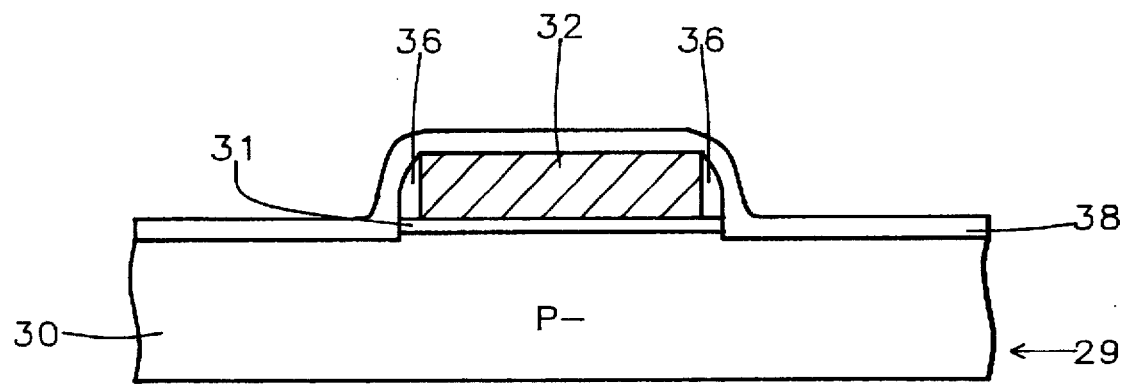
FIG. 5 shows the device of FIG. 4 after an interpolysilicon dielectric layer has been applied to the device.

FIG. 5 shows the device of FIG. 4 after an interpolysilicon dielectric layer 38 has been applied to the device. Dielectric layer 38 preferably comprises silicon dioxide $SiO_2$ formed by LPCVD (Low Pressure Chemical Vapor Deposition) decomposition of TEOS (Tetraethoxysilane $Si(OC_2H_5)_4$ at from 650° C. to 750° C. The preferred silicon dioxide dielectric layer has a preferred thickness from about 500 Å to about 3,000 Å.

Figure 6:
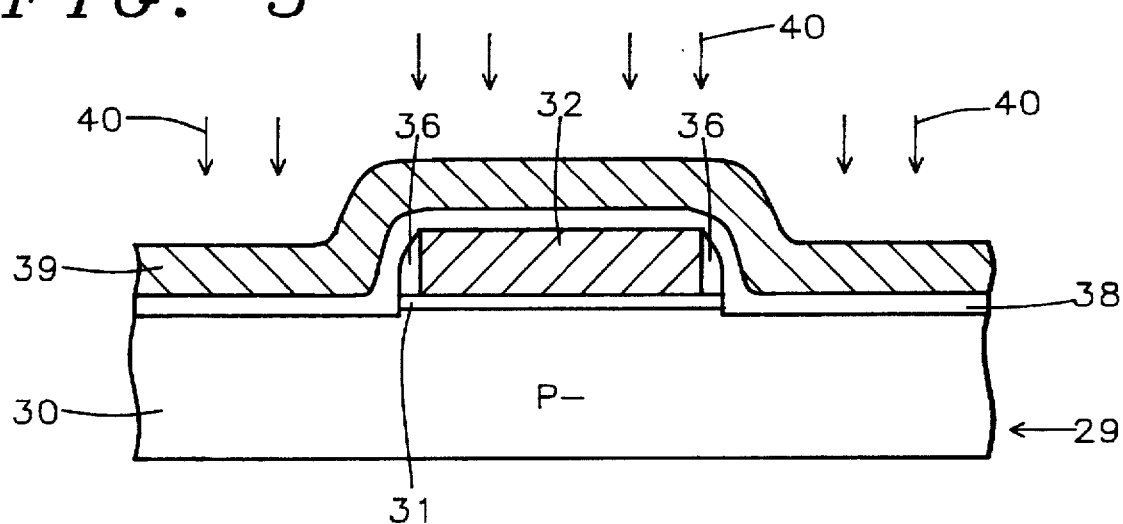
FIG. 6 shows a polycrystalline silicon containing layer above the interpolysilicon layer being lightly doped with a blanket ion implantation with N or P ions.

In FIG. 6, above the interpolysilicon layer 38, a polycrystalline silicon containing upper layer 39 composed of a material (selected from polysilicon 2 and polycide) is formed having a preferred thickness from about 300 Å to about 1,500 Å. Then the device is lightly doped with a blanket ion implantation with N or P ions 40 composed preferably of arsenic and alternatively of phosphorous, boron, or $BF_2$ applied with a dose of about $1\times10E13cm^{-2}$ to about $1\ 10E14cm^{-2}$. For arsenic, it is implanted at an energy of from about 20 keV to about 100 keV in a medium current implanter type of tool.

The chemical species of the dopant implanted can be arsenic with a dose of from about $2\ E13cm^{-2}$ to about $1\ E14cm^{-2}$, at an energy of from about 20 keV to about 80 keV as a function of the thickness of the polysilicon 2 or polycide upper layer 39. The implanted dopant is in the upper half to the middle of the polysilicon 2 or polycide layer 39.

In the flat areas all of layer 39 (composed of material selected from polysilicon 2 and polycide) is subjected to the same implant dose in FIG. 6. Where there is a step, as in regions 43 and 43', the effective length of upper layer 39 will be longer than in the flat areas 39, 42, 42' in FIG. 7 as the control gate polycrystalline silicon layer 32 has a thickness ranging from about 2,000 Å to about 5,000 Å. Thus $R_{s(flat)}$=constant1 value in the flat areas, and a $R_{s(step)}$=constant2

Note that while one usually would use the edge of a gate electrode to provide the step for the resistor in the upper layer 39, as an alternative, one can use a step other than the gate electrode. The step height is very close to the height of the gate electrode; and the step height falls within a range either greater than or less than a gate electrode in physical height.

It is preferred that the polysilicon 1 layer 32 has a thickness from about 2,000 Å to about 5,000 Å, and that the polysilicon 2 upper layer 39 has a thickness from about 300 Å to about 1,500 Å whereby the value of the resistance is as follows:

$R_s$ load with two steps (polysilicon 1 step). 1580 gigaohms/square (L/W=2.8/0.55)

$R_s$ load without steps 100 gigaohms/square

The condition is arsenic (As) 45k $9E13cm^{-2}$ with a polysilicon 2 or polycide layer thickness of about 1,000 Å.

The factors concerning the step height are as follows:

1) The polysilicon 1 layer 32 determines the step height.

2) If the step height of the polysilicon 1 layer 32 is less than 2,000 Å, $R_s$ becomes high a time delay is produced.

3) If the step height is greater than 5,000 Å topography induced polysilicon 2 or polycide upper layer 39 then problems are caused including production of an unwanted etching stringers. In addition, there is the problem that planarization of the backend process is difficult because of such a large step.

Figure 7:
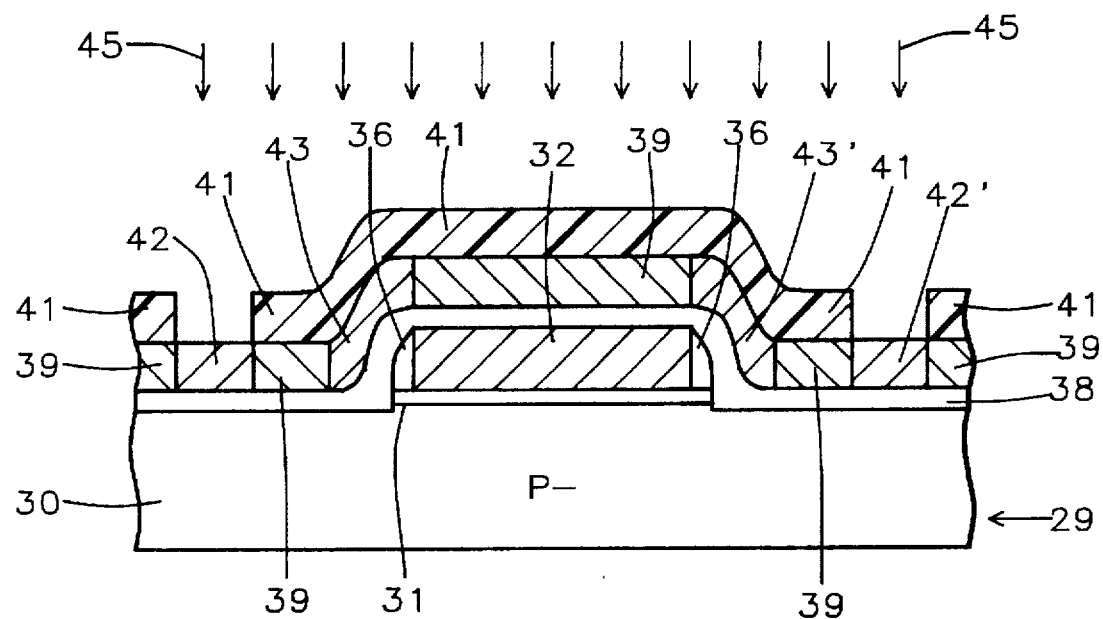
FIG. 7 shows the device of FIG. 6 after it has been coated with a photoresist pattern through which ions are implanted to apply heavy doping into contact regions to which electrical contact is to be made subsequently.

FIG. 7 shows the device of FIG. 6 after it has been coated with a photoresist pattern 41 through which ions 45 are implanted to apply heavy doping into contact regions 42, 42' to which electrical contact is to be made subsequently.

The chemical species of the dopant 45 implanted into the contact regions 42, 42' is preferably phosphorus with a dose of from about $2\ E14cm^{-2}$ to about $5E15cm^{-2}$, at an energy of from about 20 keV to about 130 keV.

Figure 8:
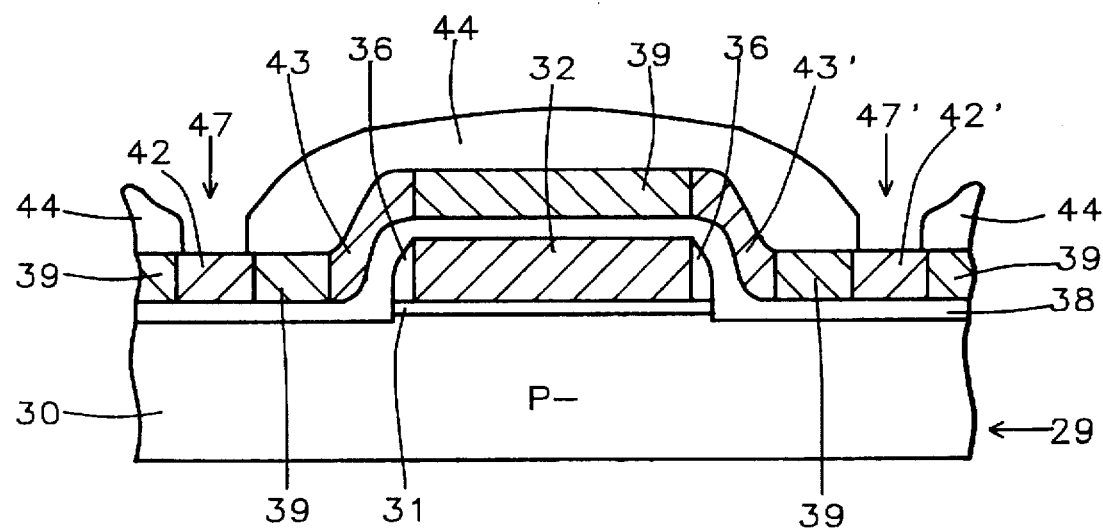
FIG. 8 shows the device of FIG. 7 after a BPSG layer has been applied, and patterned with by photolithography followed by etching layer to form openings to the surface of contacts by metal vias deposited into those openings.

FIG. 8 shows the device of FIG. 7 after a BPSG layer 44 has been applied, and patterned with by photolithography followed by etching layer 44 to form openings 47, 47' down to the surface of contacts 42, 42', by the metal vias 46, 46' deposited into those openings 47, 47'.

Figure 9:
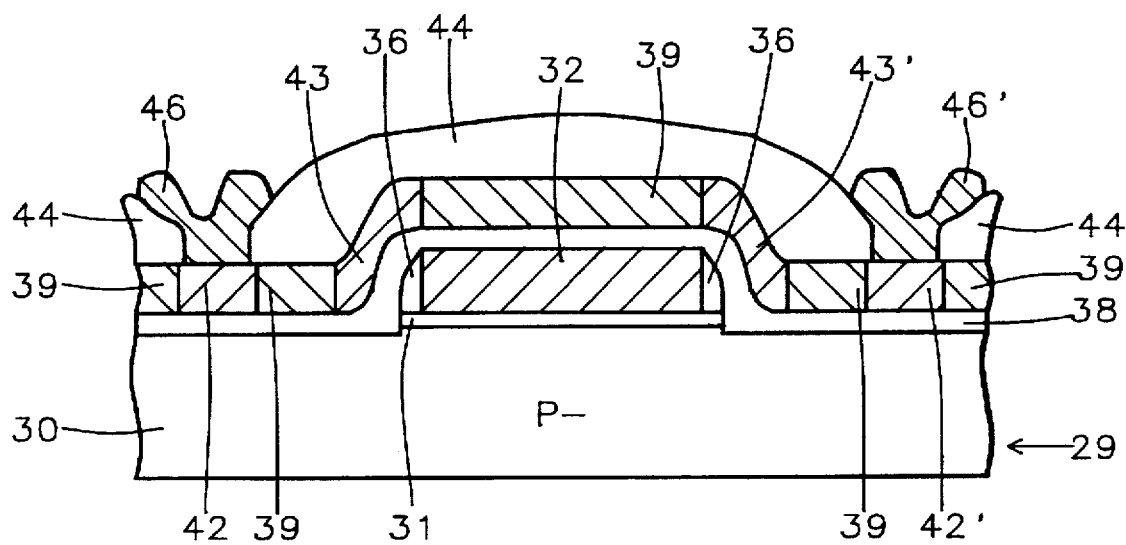
FIG. 9 shows the device of FIG. 8 after depositing metal vias into openings through BPSG layer down into contact with the surface of contacts.

FIG. 9 shows the device of FIG. 8 after depositing metal vias 46, 46' into openings 47, 47' through BPSG layer 44 down into mechanical and electrical contact with the surface of contacts 42, 42'.

Figure 10:
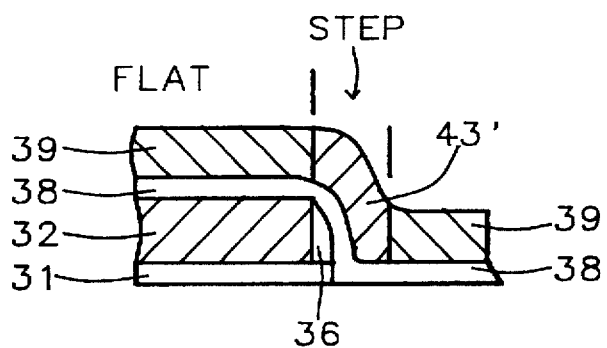
FIG. 10 shows a fragment of the device of FIG. 7 to illustrate the doping of resistor region of polycrystalline silicon containing layer composed of a material (selected from polysilicon 2 and polycide).

FIG. 10 shows a fragment of the device of FIG. 7 to illustrate the doping of resistor region 43' of polycrystalline silicon containing upper layer 39 composed of a material (selected from polysilicon 2 and polycide). Resistor region 43' is located at a step at the edge of the gate 32, above and to the right of the right hand spacer 36, which is the only one shown, for purposes of illustration.

Figure 11:
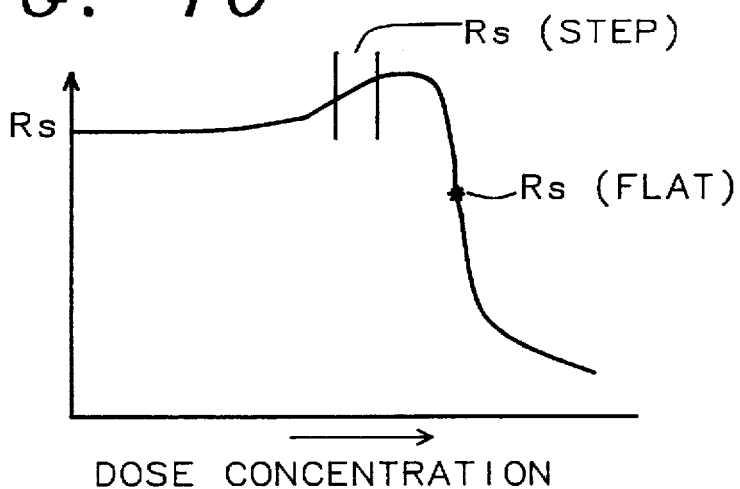
FIG. 11 shows $R_s$ load as a function of the blanket dose concentration of the light dose of arsenic ions applied in FIG. 6, with the $R_s$ (STEP) in the step area and $R_s$ (FLAT) in the flat area shown with the $R_s$ (STEP) having a significantly higher value since the dopant is spread over a longer distance at the step.

FIG. 11 shows $R_s$ load as a function of the blanket dose concentration of the light dose of arsenic ions applied in FIG. 6, with the $R_s$ (STEP) in the step area and $R_s$ (FLAT) in the flat area shown with the $R_s$ (STEP) having a significantly higher value since the dopant is spread over a longer distance at the step.

SUMMARY

There are three points which are key to this invention which are as follows.

1) The step height makes the effective length of the resistor longer.
2) The step makes the concentration in the step area less than that of the flat area which leads to the inequality $R_{s(step)} > R_{s(flat)}$.
3) The polysilicon load process can be shrunk to a smaller dimension while maintaining the required resistance value.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device formed on the surface of a semiconductor substrate including an SRAM cell with a resistor comprising:

a gate oxide layer formed upon said substrate, a control gate formed from a first polycrystalline silicon containing layer formed on said gate oxide layer, said control gate having been patterned into a control gate stack with sidewalls, dielectric spacers forming steps on the sidewalls of said control gate stack, a blanket, interpolysilicon dielectric layer formed over said device including said control gate, said spacers and said surface of said substrate aside from said stack and said spacers, with said steps on either side of said control gate, an upper polycrystalline silicon containing layer formed over said interpolysilicon dielectric layer, said upper layer having been doped in a blanket implant of a light dose of dopant including highly resistive regions with far higher resistivity over said steps.

2. The device of claim 1 wherein said light dose of dopant is selected from arsenic, phosphorus, boron, and $BF_2$ ions having been implanted within the range from about $1E13cm^{-2}$ to about $1E14cm^{-2}$.

3. The device of claim 1 wherein said light dose comprises arsenic ions having been implanted within the range from about $2E14cm^{-2}$ to about $5E15cm^{-2}$.

4. The device of claim 3 wherein said said first polycrystalline silicon containing control gate layer has a thickness from about 2,000 Å to about 5,000 Å, and said upper polycrystalline silicon containing layer has a thickness from about 300 Å to about 1,500 Å and said interpolysilicon dielectric layer has a thickness from about 500 Å to about 3,000 Å.

5. The device of claim 4 wherein contacts are formed on said device, into a region having been doped with a dose comprising phosphorus ions implanted within the range from about $2E14cm^{-2}$ to about $5E15cm^{-2}$.

6. A semiconductor device on a semiconductor substrate including an SRAM cell with a resistor comprising:

a gate oxide layer on said substrate, a control gate formed on said gate oxide layer, said control gate having a thickness between about 2,000 Å and about 5,000 Å and containing polycrystalline silicon, silicon dioxide spacers adjacent to said control gate forming steps on either side of said control gate, a dielectric layer over said control gate, said spacers and said substrate, said dielectric layer having a thickness between about 300 Å and about 1,500 Å, an upper layer containing polycrystalline silicon extending formed over said dielectric layer including said steps, said upper silicon layer having a thickness between about 300 Å and about 1,500 Å, and said upper layer having been implanted with a light dose of dopant sufficient to form a resistor including ion implanting resistive regions with higher resistivity in the regions over said steps on either side of said control gate with a far lower resistivity aside from said steps, and contact regions in said resistor and metal vias on both sides of said control gate connected to said contact regions.

7. The device of claim 6 wherein said dopant is selected from the group consisting of arsenic, phosphorus, boron, and $BF_2$ ions, said ions having been implanted within the range from about $1E13cm^{-2}$ to about $1E14cm^{-2}$.

8. The device of claim 6 wherein said light dose comprises arsenic ions which had been implanted within the range from about $2E13cm^{-2}$ to about $1E14cm^{-2}$.

9. The device of claim 6 wherein said light dose comprises phosphorus ions which had been implanted within the range from about $2E14cm^{-2}$ to about $5E15cm^{-2}$.

10. A semiconductor device on a semiconductor substrate including an SRAM cell with a resistor comprising:

a gate oxide layer on said substrate, a control gate comprising a first polycrystalline silicon containing layer on said gate oxide layer, said first polycrystalline silicon containing layer having a thickness between about 2,000 Å and about 5,000 Å, spacers composed of silicon dioxide formed adjacent to said control gate forming steps on either side of said control gate, an interpolysilicon dielectric layer formed over said control gate and said steps, said dielectric layer having a thickness between about 300 Å and about 1,500 Å, a second polycrystalline silicon containing layer extending over said interpolysilicon dielectric layer including said steps, said second polycrystalline silicon containing layer having a thickness between about 300 Å and about 1,500 Å, said second polycrystalline silicon containing layer having been implanted with a light dose of dopant sufficient to form a resistor including ion implanted resistive regions with far higher resistivity of about 1580 gigaohms/square in the regions over said steps on either side of said control gate and a lower resistivity on the order of about 100 gigaohms/square elsewhere, contact openings over the flat areas of said second polycrystalline silicon which overlie said gate oxide layer having been doped to form contacts below said contact openings in said flat areas on said gate oxide layer, a BPSG layer over said device with via openings in said BPSG layer over said contacts, and metal vias formed in said via openings.

11. The semiconductor device in accordance with claim 10 wherein said dopant selected from the group consisting of arsenic, phosphorus, boron, and $BF_2$ ions had been implanted within the range from about $1E13cm^{-2}$ to about $1E14cm^{-2}$.

12. The device in accordance with claim 10 wherein said dopant selected from the group consisting of arsenic, phosphorus, boron, and $BF_2$ ions, said dopant having been implanted within the range from about $1E13cm^{-2}$ to about $1E14cm^{-2}$ having been applied at from about 20 keV to about 100 keV.

13. The device in accordance with claim 10 wherein said light dose comprises arsenic ions implanted within the range from about $2E13cm^{-2}$ to about $1E14cm^{-2}$.

14. The device in accordance with claim 10 wherein said dopant selected from the group consisting of arsenic, phosphorus, boron, and $BF_2$ ions, said ions had been implanted within the range from about $1E13cm^{-2}$ to about $1E14cm^{-2}$, having been applied at from about 20 keV to about 100 keV.

15. The semiconductor device in accordance with claim 10 wherein said light dose comprises arsenic ions which had been implanted within the range from about $2E13cm^{-2}$ to about $1E14cm^{-2}$ having been applied at from about 20 keV to about 100 keV.

* * * * *